United States Patent
Cheng et al.

(10) Patent No.: US 7,767,541 B2
(45) Date of Patent: Aug. 3, 2010

(54) METHODS FOR FORMING GERMANIUM-ON-INSULATOR SEMICONDUCTOR STRUCTURES USING A POROUS LAYER AND SEMICONDUCTOR STRUCTURES FORMED BY THESE METHODS

(75) Inventors: Kangguo Cheng, Beacon, NY (US); Brian Joseph Greene, Yorktown Heights, NY (US); Jack Allan Mandelman, Flat Rock, NC (US)

(73) Assignee: International Business Machines Corporation, Armonk, NY (US)

( * ) Notice: Subject to any disclaimer, the term of this patent is extended or adjusted under 35 U.S.C. 154(b) by 167 days.

(21) Appl. No.: 11/259,297

(22) Filed: Oct. 26, 2005

(65) Prior Publication Data

US 2007/0093036 A1 Apr. 26, 2007

(51) Int. Cl.
H01L 21/30 (2006.01)
H01L 21/46 (2006.01)
(52) U.S. Cl. ............... 438/455; 438/458; 438/459; 438/558; 438/563; 438/933; 257/E21.122
(58) Field of Classification Search .......... 438/455, 438/20, 221, 458, 459, 558, 563, 933; 257/506, 257/E21.122
See application file for complete search history.

(56) References Cited

U.S. PATENT DOCUMENTS

| | | | |
|---|---|---|---|
| 4,806,996 A | 2/1989 | Luryi | |
| 5,366,923 A | 11/1994 | Beyer et al. | |
| 5,453,394 A | 9/1995 | Yonehara et al. | |
| 5,757,024 A * | 5/1998 | Fathauer et al. | 257/19 |
| 6,800,518 B2 | 10/2004 | Bendernagel et al. | |
| 6,812,115 B2 * | 11/2004 | Wieczorek et al. | 438/424 |
| 6,828,214 B2 * | 12/2004 | Notsu et al. | 438/455 |
| 6,881,650 B2 | 4/2005 | Lee et al. | |
| 7,125,458 B2 * | 10/2006 | Bedell et al. | 148/239 |
| 2002/0146892 A1 * | 10/2002 | Notsu et al. | 438/455 |
| 2004/0227187 A1 * | 11/2004 | Cheng et al. | 257/347 |
| 2005/0056352 A1 | 3/2005 | Bedell et al. | |
| 2005/0067294 A1 | 3/2005 | Choe et al. | |
| 2005/0136588 A1 * | 6/2005 | Speyer | 438/221 |
| 2005/0148122 A1 * | 7/2005 | Yonehara | 438/149 |
| 2006/0175608 A1 * | 8/2006 | Celler | 257/49 |
| 2006/0234477 A1 * | 10/2006 | Gadkaree | 438/478 |
| 2007/0170541 A1 * | 7/2007 | Chui et al. | 257/506 |

FOREIGN PATENT DOCUMENTS

WO 2004/100268 A1 11/2004

OTHER PUBLICATIONS

Takao Yonehara et al., "Cutting Edge 2: ELTRAN®; Novel SOI Wafer Technology," JSAP International, No. 4, Jul. 2001, http://www.canon.com/eltran/.
US Patent and Trademark Office, Office Action issued in related U.S. Appl. No. 12/120,455 dated Mar. 12, 2009 (6 pages).

* cited by examiner

Primary Examiner—Kiesha R Bryant
Assistant Examiner—Telly D Green
(74) Attorney, Agent, or Firm—Wood, Herron & Evans, LLP

(57) ABSTRACT

A semiconductor structure that includes a monocrystalline germanium-containing layer, preferably substantially pure germanium, a substrate, and a buried insulator layer separating the germanium-containing layer from the substrate. A porous layer, which may be porous silicon, is formed on a substrate and a germanium-containing layer is formed on the porous silicon layer. The porous layer may be converted to a layer of oxide, which provides the buried insulator layer. Alternatively, the germanium-containing layer may be transferred from the porous layer to an insulating layer on another substrate. After the transfer, the insulating layer is buried between the latter substrate and the germanium-containing layer.

22 Claims, 3 Drawing Sheets

METHODS FOR FORMING GERMANIUM-ON-INSULATOR SEMICONDUCTOR STRUCTURES USING A POROUS LAYER AND SEMICONDUCTOR STRUCTURES FORMED BY THESE METHODS

FIELD OF THE INVENTION

The invention relates generally to semiconductor structures and methods and, in particular, to methods for forming germanium-on-insulator semiconductor structures and semiconductor structures formed by these methods.

BACKGROUND OF THE INVENTION

Germanium-on-insulator (GOI) substrates may play an important role in future complementary metal oxide semiconductor (CMOS) scaling. In the semiconductor community, germanium (Ge) is widely recognized as having higher carrier mobility than silicon (Si) for both electrons and holes, as well as lower contact resistance and lower dopant activation temperatures that facilitate the formation of shallow junctions. The development of high-k dielectrics with a dielectric constant greater than silicon oxide ($SiO_2$) for use as a gate insulator in metal oxide semiconductor field effect transistors (MOSFETs) is expected to provide a solution to the general poor quality of germanium oxide, which has historically represented a significant obstacle to the utilization of germanium in device fabrication.

MOSFETs may be manufactured using either bulk or silicon-on-insulator (SOI) substrates. The use of SOI substrates reduces parasitic junction capacitances and allows for greater channel currents that, in turn, allow for faster speeds than comparable devices fabricated in bulk silicon wafers. MOSFETs formed on SOI substrates have several additional advantages over comparable devices formed on conventional bulk substrates such as the elimination of latch-up, improved radiation hardness, and simplified device isolation and fabrication. The improved MOSFET device performance obtained with SOI substrates may also be expected with GOI substrates.

The large lattice constant mismatch between silicon and germanium precludes direct growth of epitaxial germanium on single crystal silicon without nucleation of a high density of defects such as threading dislocations. One traditional solution to this limitation is growth of compositionally graded layers where a large lattice constant mismatch is spread across several low-mismatch interfaces, thereby minimizing nucleation of threading dislocations. Compositional grading of relaxed $Si_{1-x}Ge_x$ layers of increasing germanium fraction may be used to create an arbitrary lattice constant ranging from that of silicon to germanium on a bulk silicon substrate. Typically, a thick $Si_{1-x}Ge_x$ buffer layer is grown on a silicon wafer and a thin strain-relaxed layer of $Si_{1-x}Ge_x$ is grown on the buffer layer. By adjusting the deposition parameters for the $Si_{1-x}Ge_x$ layers, the threading dislocations do not propagate vertically but instead propagate in the plane of the layers and subsequently end at the peripheral edges of the layers. A thin monocrystalline germanium active layer may be grown epitaxially on the relaxed layer of a similar lattice constant.

The first wafer with the monocrystalline germanium active layer is then bonded to a second bulk silicon wafer that is covered by an insulator layer, typically oxide. To that end, the monocrystalline germanium active layer is contacted with the insulator layer on the second wafer. The first wafer, the buffer layer, and the relaxed layer are then removed by grinding and/or etching, which leaves the monocrystalline germanium active layer on the buried insulator layer and thereby defines the GOI substrate.

There are several drawbacks associated with this conventional approach for forming GOI substrates. First, a significantly thick buffer layer is required, usually greater than one micrometer, to confine the threading dislocations and prevent their propagation into the monocrystalline germanium active layer. Growing a buffer layer of sufficient thickness to accomplish this objective requires an extensively long process duration and, therefore, the process throughput is limited. Second, a significant density of threading dislocations may nevertheless propagate from the buffer layer into the relaxed layer during epitaxial growth and/or during the subsequent thermal process. These threading dislocations may continue to propagate into the germanium layer, which results in a defective active layer for device formation. Third, the germanium concentration in the buffer layer has to be gradually increased during the epitaxial growth. Such precise control over the germanium concentration during buffer layer growth is technologically challenging. Finally, removing the relaxed layer selective to the monocrystalline germanium active layer is also challenging. Poor selectivity may cause undesired etching of the monocrystalline germanium active layer during removal of the relaxed layer, which may result in thickness variations.

What is needed, therefore, is a method for forming a semiconductor structure for use as a GOI substrate that overcomes the disadvantages of conventional methods of manufacturing such semiconductor structures, such as using compositionally graded layers to accommodate lattice mismatch.

SUMMARY OF THE INVENTION

The present invention is generally directed to methods for forming cost-effective, substantially defect-free germanium-on-insulator (GOI) substrates using a silicon handle wafer. In accordance with an embodiment of the present invention, a method of fabricating a semiconductor structure for use in forming a germanium-on-insulator substrate comprises forming a porous layer, advantageously a porous silicon layer, on a first substrate and forming a germanium-containing layer on the porous layer.

In accordance with another embodiment of the present invention, a method of fabricating a semiconductor structure comprises forming a porous layer, advantageously a porous silicon layer, on a substrate and forming a germanium-containing layer on the porous layer. The method further comprises converting the porous layer to a layer of oxide.

In accordance with yet another embodiment of the present invention, a method for fabricating a semiconductor structure comprises forming a porous layer, advantageously a porous silicon layer, on a first substrate and forming a germanium-containing layer on the porous layer. The method further comprises transferring the germanium-containing layer from the porous layer to an insulating layer on a second substrate.

In another aspect of the present invention, a semiconductor structure comprises an insulator layer formed by oxidizing a porous layer, advantageously a porous silicon layer, to form an oxide and a germanium-containing layer on the insulator layer. The germanium-containing layer may further comprise a monocrystalline layer of substantially pure germanium.

The germanium-containing layer, which may be pure monocrystalline germanium, may be deposited directly on the porous layer because stress arising from the lattice mismatch between silicon and germanium is relaxed by the porous material, such as silicon, constituting the porous layer. As a result, a thick compositionally graded layer is not required to spread the lattice constant mismatch across several intermediary low-mismatch interfaces for minimizing nucleation of threading dislocations.

BRIEF DESCRIPTION OF THE DRAWINGS

The accompanying drawings, which are incorporated in and constitute a part of this specification, illustrate embodiments of the invention and, together with a general description of the invention given above and the detailed description of the embodiments given below, serve to explain the principles of the invention.

DETAILED DESCRIPTION

Figure 1:
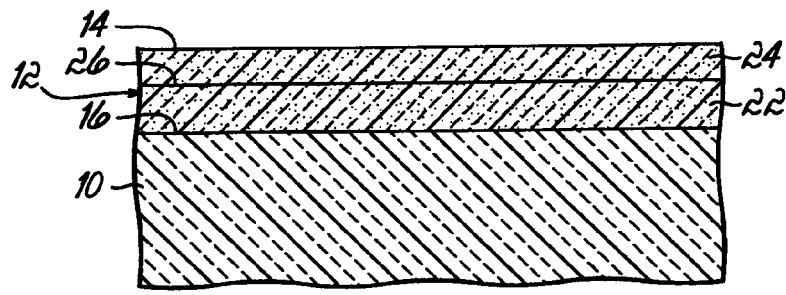
FIGS. 1 through 5 are diagrammatic views of a portion of a substrate at various fabrication stages of a processing method in accordance with an embodiment of the present invention.

The present invention provides a semiconductor structure that may be used as a germanium-on-insulator (GOI) substrate for device fabrication. The GOI substrate of the present invention may be particularly advantageous for forming complementary metal oxide semiconductor field effect transistors (CMOSFETs) as a substitute for, or complement to, conventional silicon-on-insulator (SOI) substrates. Germanium (Ge) advantageously has a significantly higher carrier mobility than silicon (Si) for both electrons and holes, as well as lower contact resistance and lower dopant activation temperatures that facilitate the formation of shallow junctions. The present invention will now be described in greater detail by referring to the drawings that accompany the present application.

With reference to FIG. 1, a porous layer 12 is formed on a first substrate 10. Substrate 10 may be a bulk silicon substrate, in which instance the porous layer 12 represents a depth over which the constituent monocrystalline silicon has been converted to porous silicon, or an active silicon SOI layer of an SOI substrate, in which instance the porous layer 12 represents a depth over which the constituent monocrystalline silicon of the SOI active layer has been converted to porous silicon. The porous layer 12 extends from a surface 14 that is exposed to an interface 16 with the portion of the substrate 10 that is not converted to porous material, such as porous silicon. The thickness of the porous layer 12 preferably ranges from about 50 nm to about 500 nm, as measured between exposed surface 14 and interface 16, and substrate 10 has a considerably greater thickness for supporting the porous layer 12. Advantageously, the porous layer 12 may be substantially pure silicon that originates from the substrate 10. Alternatively, the surface 14 of substrate 10 may include an additive epitaxially-grown silicon layer or a silicon germanium layer (not shown) that is converted to provide the porous layer 12.

In one embodiment of the invention, the porous layer 12 may be formed by converting the monocrystalline silicon of substrate 10 to porous silicon using a process that includes doping and anodization. To that end, a high concentration of a p-type dopant is introduced into the substrate 10 by, for example, gas phase doping, solid source doping, ion implantation, or a combination of these techniques. The p-type dopant may be selected from gallium (Ga), aluminum (Al), boron (B), or a combination of these dopants, and may be introduced at an atomic concentration ranging from about $5 \times 10^{17}$ cm$^{-3}$ to about $1 \times 10^{21}$ cm$^{-3}$. The substrate 10 may be annealed during the doping process or optionally annealed after the p-type dopant is introduced to uniformly distribute the p-type dopant. Alternatively, a n-type dopant selected from phosphorus (P), arsenic (As), antimony (Sb), or a combination of these dopants, and may be used for forming the porous layer 12.

The heavily doped silicon is then subjected to an anodization process in an aqueous electrolyte or anodization solution that typically contains hydrofluoric acid (HF), such as a mixture of HF and a monohydric alcohol such as methanol, ethanol, or n- or iso-propanol. The monohydric alcohol is added to the solution to improve the wettability of the hydrofluoric acid. The substrate 10 is contacted with a positively-biased electrode and immersed, along with a separate negatively-biased electrode, into a bath of the anodization solution. An electrical current is flowed through the electrodes and the substrate 10 for an anodization time sufficient to convert the heavily doped silicon to porous silicon and complete the process forming porous layer 12. A light source may be optionally used to illuminate the substrate 10 while electrical current is flowing. The anodization process may be performed with the bath at room temperature or at a temperature above room temperature. Following the anodization process, the substrate 10 may be rinsed with deionized water and dried.

The anodization process creates pores across the thickness of the porous layer 12 to the interface 16. The resulting porosity is proportional to material properties such as the p-type dopant concentration, and to other non-material properties including, but not limited to, the anodization current and voltage, the acid concentration in the anodization solution, illumination, and the temperature of the anodization solution. For example, the anodization process forming the porous layer 12 may be carried out in an aqueous 1:1 HF (49%) and ethanol solution at a current density ranging from about 1 mA/cm$^2$ to about 40 mA/cm$^2$ in the dark and at room temperature with a process time ranging from several minutes to one hour.

The porous layer 12 may include multiple sub-layers 22, 24 joined along a seam 26. The sub-layers 22, 24 of differing porosity may be formed by changing the anodization current to two different values during the anodization process. Additional sub-layers (not shown) may be provided within the porous layer 12 by anodizing at different currents.

Figure 2:
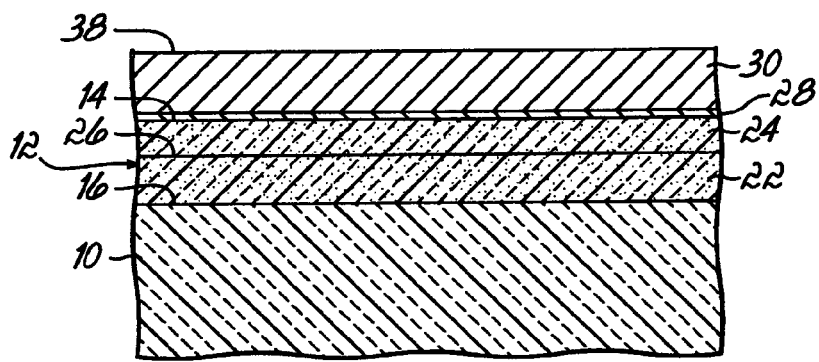

With reference to FIG. 2 in which like reference numerals refer to like features in FIG. 1 and at a subsequent fabrication stage, a thin surface layer 28 is formed to a shallow depth across the exposed surface 14 of porous layer 12. Surface layer 28 smoothes surface roughness and seals pores in the porous layer 12 that would otherwise intersect the surface 14 and open to, or communicate with, the ambient environment about the surface 14. One process suitable for forming surface layer 28 is a hydrogen anneal in a hydrogen-rich atmosphere, such as hydrogen (H$_2$), deuterium (D$_2$), a mixture of H$_2$ and/or D$_2$ with nitrogen (N$_2$) and/or argon (Ar), or ammonia (NH$_3$), at a temperature between 800° C. and 1100° C., and for a time ranging from about ten (10) seconds to about two (2) minutes. The thickness of the surface layer 28 may range from about 1 nm to 20 nm or, alternatively, from about 5 nm to about 10 nm.

A layer 30 of germanium is epitaxially grown on the porous layer 12. Surface layer 28, which may consist of monocrystalline silicon, provides a crystalline template for the epitaxial growth of germanium layer 30. Germanium layer 30 may be deposited by a chemical vapor deposition (CVD) process using germane (GeH$_4$) source gas, but any deposition process apparent to a person having ordinary skill in the art may be used. Optionally, dopants can be incorporated into the germanium layer during deposition. Although not wishing to be bound by theory, stresses developed by the lattice mismatch between silicon and germanium are believed to be relieved by the underlying porous layer 12. Thus, a high-quality, low-defect epitaxial germanium layer 30 is formed. The thickness of the germanium layer 30 preferably ranges from about 5 nm to about 200 nm. The composition of the germanium layer 30 may be substantially pure or may include low levels of intentional or unintentional impurities such that the germanium layer 30 may be considered to be a germanium-containing layer. However, any impurities that may be included in the germanium layer 30 do not provide strain relief in the manner of a buffer layer or a compositionally graded layer.

Figure 3:
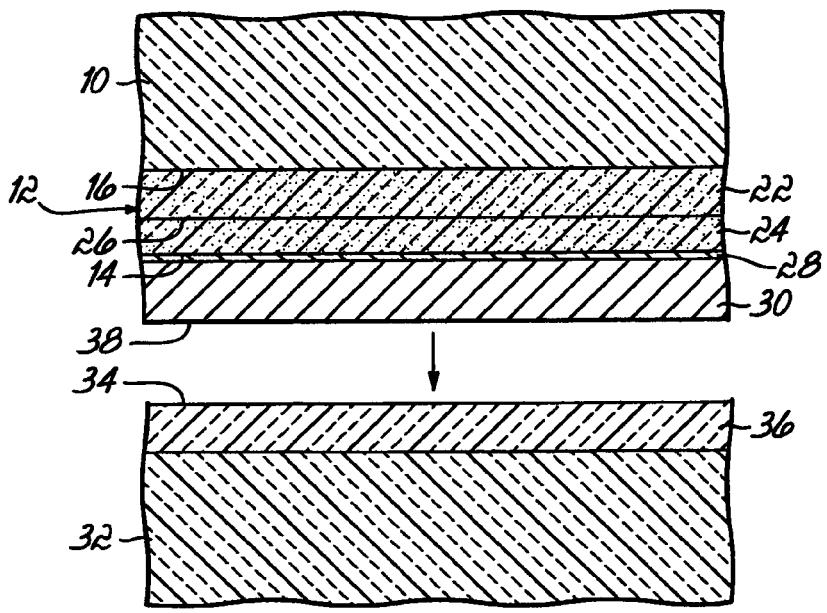

With reference to FIG. 3 in which like reference numerals refer to like features in FIG. 2 and at a subsequent fabrication stage, a second substrate 32 is provided that has an exposed surface 34 defined by an insulating layer 36, which constitutes an oxide or another suitable insulating material. If the insulating layer 36 is formed of oxide, the constituent oxide may be formed by thermal oxidation. Alternatively, any other suitable technique, such as CVD, may be used for forming the insulating layer 36. Optionally, the insulating layer 36 may be planarized by, for example, a conventional chemical mechanical polishing (CMP) process to be approximately flat.

An exposed surface 38 of the germanium layer 30 is bonded to the exposed surface 34 of insulating layer 36 on the second substrate 32. The contacting exposed surfaces 34, 38 are bonded together by a conventional bonding process that exposes the contacting surfaces 34, 38 to conditions that are capable of increasing their mutual bonding energy.

Optionally, an insulating layer (not shown) may be formed on the surface 38 of the germanium layer 30 before bonding. The optional insulating layer may constitute an oxide or another suitable insulating material formed any suitable technique including, but not limited to, thermal oxidation or CVD deposition. If the optional insulating layer is formed by thermal oxidation, an optional silicon layer (not shown) may be epitaxially grown on the germanium layer 30 and converted to oxide by oxidation. If the optional insulating layer is formed on the surface 38 of the germanium layer 30, the surface of this optional insulating layer may be bonded to the exposed surface 34 of insulating layer 36 on the second substrate 32.

A typical conventional bonding process involves a low temperature thermal treatment or anneal at a sufficient temperature and for a sufficient duration to cause bonding. For example, the bonding process may be provided by contacting the exposed surface 38 of the germanium layer 30 with the exposed surface 34 of insulating layer 36 and annealing at a temperature ranging from 500° C. to 800° C. Optionally, the substrates 10, 32 may be clamped together during the thermal anneal by an external force applying mechanical pressure typically between about 2 kg/cm$^2$ and about 2.5 kg/cm$^2$. The thermal anneal, which may be performed in the presence or absence of an external force, is also typically performed in a controlled atmosphere consisting of an inert gas, such as N$_2$. Advantageously, the contacted surfaces 34, 38 each have a flat, smooth finish before bonding.

Figure 4:
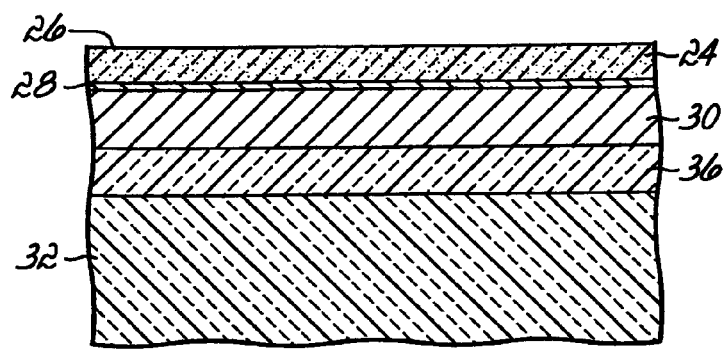

With reference to FIG. 4 in which like reference numerals refer to like features in FIG. 3 and at a subsequent fabrication stage, substrate 10 is separated from the porous layer 12 by splitting the constituent porous material, such as porous silicon. One method for splitting the porous layer 12 uses a water jet to initiate a fracture that propagates along the seam 26 located between the two porous sub-layers 22, 24 of different porosities in porous layer 12. Alternatively, other methods may be used to fracture the seam 26 or to initiate and propagate a fracture through the porous layer 12 that lacks multiple sub-layers 22, 24. If fracture occurs along seam 26, sublayer 24 will remain bonded to germanium layer 30 after the rest of substrate 10 is removed. However, the invention is not so limited as the porous layer 12 may be fractured in any lateral plane between surface 14 and interface 16.

Figure 5:
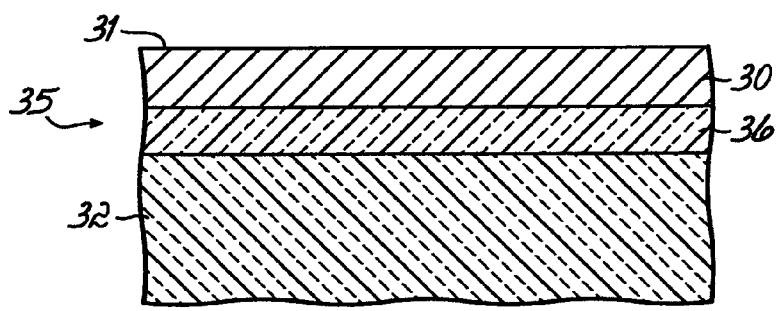

With reference to FIG. 5 in which like reference numerals refer to like features in FIG. 4 and at a subsequent fabrication stage, any remaining porous material, such as porous silicon, from porous layer 12, such as sublayer 24 or surface layer 28, is removed from a surface 31 of germanium layer 30, which was formerly coextensive with the surface layer 28. The sublayer 24 of porous silicon is removed by using an etching process having a high selectivity relative to the monocrystalline germanium in germanium layer 30. For example, an aqueous etchant solution consisting of a mixture of HF, H$_2$O$_2$, and H$_2$O exhibits an etch selectivity greater than about 10,000. The high etch rate ratio results in rapid removal of the porous silicon with a negligible effect on the monocrystalline germanium.

Depending on the subsequent processes, the surface layer 28 containing silicon may or may not be removed. An ammonia-based aqueous etchant or other suitable techniques, such as plasma etch or polishing, may be used to desirably remove the surface layer 28. Alternatively, only the porous layer 24 is removed and the surface layer 28 remains atop the germanium layer 30 as a sacrificial and/or protection layer in subsequent processes. Optionally, a mechanical polish and/or hydrogen anneal may be performed to planarize and expose surface 31 of the germanium layer 30.

The resultant GOI semiconductor structure or wafer 35 is now ready for further semiconductor processing, such as the fabrication of CMOSFETs, in which devices are formed using the active GOI layer of crystalline germanium defined by germanium layer 30. Optionally, a cap layer of monocrystalline silicon (not shown), if not formed in previous processes as surface layer 28, may be formed atop the germanium layer 30 as a sacrificial and/or protection layer in the subsequent process.

Figure 6:
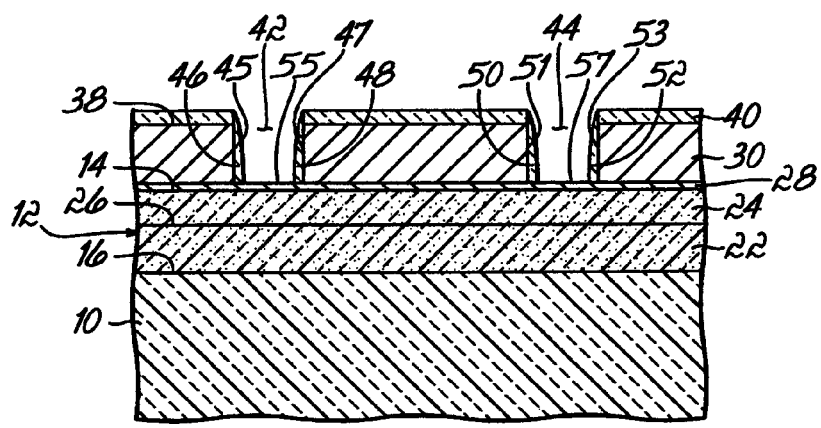
FIGS. 6 and 7 are diagrammatic views of a portion of a substrate at various fabrication stages of a processing method in accordance with an alternative embodiment of the present invention.

With reference to FIG. 6, isolation regions are integrated within the low-defect germanium layer 30 in accordance with an alternative embodiment of the present invention. At a fabrication stage subsequent to FIG. 2, a cap layer 40 is formed on the surface 38 of germanium layer 30 across substrate 10. The material constituting cap layer 40 is selected such that cap layer 40 functions as a hardmask and as a polish stop layer during subsequent fabrication stages. The cap layer 40 may be composed of nitride formed utilizing a conventional deposition process such as CVD or plasma-assisted CVD. The cap layer 40 may be further composed of an optional underlying oxide layer that is formed on the surface of the germanium layer 30. The material forming cap layer 40 must also etch selective to the porous layer 12 and the germanium layer 30. The total thickness of the cap layer 40 may be about 20 nm to about 500 nm. Optionally, a silicon layer (not shown) may be epitaxially grown atop the germanium layer 30 before the cap layer 40 is formed. Part or all of the epitaxial silicon layer may be oxidized to form the optional oxide layer before the subsequent overlying layer (e.g., nitride) is deposited.

The cap layer 40 is patterned by a conventional lithography and etching process. The lithography process applies a resist (not shown) on cap layer 40, exposes the resist to a pattern of radiation, and develops the transferred pattern in the exposed resist. The resist pattern is transferred to the cap layer 40 by a series of anisotropic dry etches, such as reactive-ion etching (RIE) or a plasma etching process, that patterns the cap layer 40 using the patterned resist as an etch mask and then patterns the germanium layer 30 using the patterned cap layer 40 as a hard mask. The latter dry etching process removes the germanium-containing material of the germanium layer 30 selective to the constituent material, such as porous silicon, of porous layer 12, although the invention is not so limited. The pattern transferred to the germanium layer 30 includes a plurality of trenches, of which trenches 42 and 44 are visible in FIG. 6.

Spacers 46, 48 are formed on sidewalls 45, 47 of trench 42, spacers 50, 52 are formed on sidewalls 51, 53 of trench 44, and similar spacers (not shown) are formed on the sidewalls of other trenches (not shown) patterned in germanium layer 30. Spacers 46, 48, 50, 52 may be defined from a conformal layer (not shown) of a dielectric material, such as 2 nm to 50 nm of nitride deposited by CVD, that is anisotropically etched using a reactive ion etch (RIE) or plasma etching process, that removes the material of the conformal layer primarily from horizontal surfaces selective to (i.e., with a significantly greater etch rate than) the constituent materials of germanium layer 30. A base 55 of trench 42 and a base 57 of trench 44 are exposed after the spacers 46, 48, 50, 52 are formed.

Figure 7:
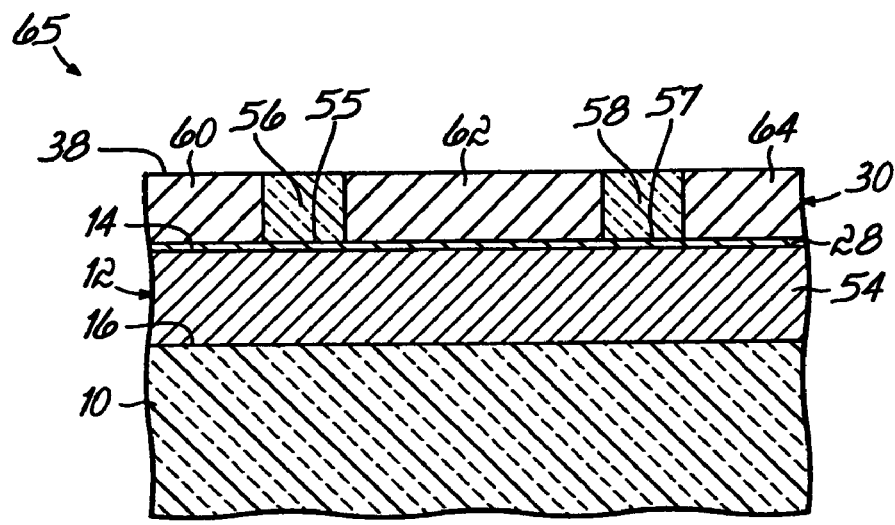

With reference to FIG. 7 in which like reference numerals refer to like features in FIG. 6 and at a subsequent fabrication stage, the porous material, such as porous silicon, in porous layer 12 (FIG. 6) is converted to a layer 54 of an oxide (e.g., silicon dioxide), which may or may not be pore-free. Thermal oxidation process performed in a dry or wet oxidizing ambient atmosphere and at a temperature ranging from about 750° C. to about 1100° C. can be used to convert porous layer 12 to oxide layer 54. Alternative processes for converting the porous layer 12 to oxide layer 54 include, but are not limited to, plasma oxidation, ozone oxidation, chemical oxidation, or any suitable combination of these techniques. The oxidizing species is directed through the exposed base 55 of trench 42 and the exposed base 57 of trench 44 to reach the porous layer 12. Because an oxygen-containing species diffuses rapidly through the porous material, such as porous silicon, of porous layer 12, oxidation is relatively rapid as the oxygen-containing species reacts with the porous silicon to form oxide. The cap layer 40 and spacers 46, 48, 50, 52 protect the germanium layer 30 against oxidation. Depending on the original thickness, part or all of the surface layer 28 of silicon may also be converted to oxide during the oxidation, resulting in a dense oxide layer because the original surface layer 28 is virtually free of pores. Preferably, at least part of the surface layer 28 beneath the germanium-containing layer 30 remains to prevent undesired oxidation of the overlying germanium-containing layer 28. Although not wishing to be bound by theory, defects are believed not to be formed in the overlying germanium layer 30 because any stress, if present, will be relieved by the porous oxide layer 54.

The cap layer 40 and spacers 46, 48, 50, 52 are stripped from the surface 38 of germanium layer 30. If cap layer 40 and spacers 46, 48, 50, 52 are constituted by nitride, a wet isotropic etch process using hot acid, such as phosphoric acid, may be employed to remove nitride selective to germanium. Finally, plugs 56, 58 of an insulator are formed in the trenches 42, 44 by depositing a layer of the insulator, such as a CVD oxide like tetraethylorthosilicate (TEOS) or a high density plasma (HDP) oxide process that preferentially deposits oxide on horizontal surfaces, and planarizing with a conventional planarization process, such as CMP, to the surface 38 of the germanium layer 30. Optionally, a thin liner (not shown) may be deposited to cover the top surface 38 of the germanium layer 30, trench sidewalls and bottoms before filling trenches. Advantageously, the liner may be composed of an oxide and/or a nitride formed by a conformal deposition technique, such as low-pressure CVD, plasma-enhanced CVD or atomic layer deposition (ALD). The insulating material of plugs 56, 58, in cooperation with the optional liner, electrically isolates adjacent active islands or regions 60, 62, 64 from each other in the manner of shallow trench isolation (STI). A person having ordinary skill in the art will understand that additional plugs and regions (not shown) are defined across the surface 38 of the germanium layer 30.

The resultant GOI semiconductor structure or wafer 65 is now ready for further semiconductor processing, such as the fabrication of CMOSFETs, in which devices are formed using the active GOI layer of crystalline germanium defined by germanium layer 30.

Figure 8:
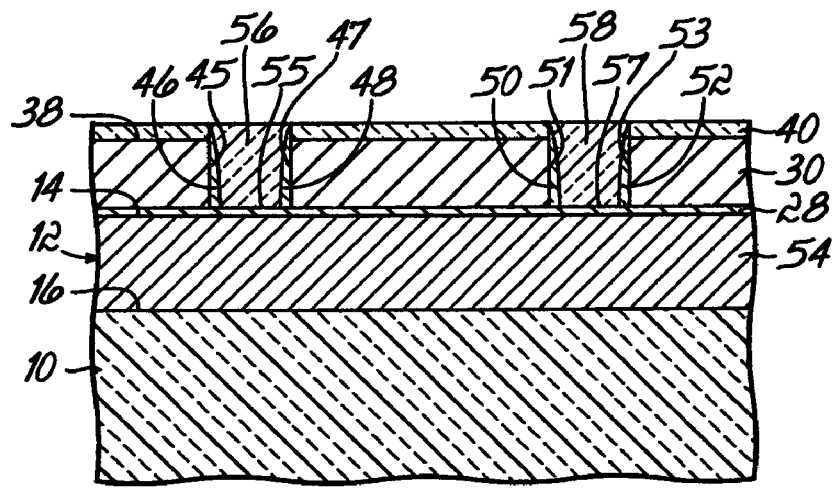
FIG. 8 is a diagrammatic view of a portion of a substrate at a fabrication stage of a processing method in accordance with an alternative embodiment of the present invention.

With reference to FIG. 8 in which like reference numerals refer to like features in FIG. 6 and at a subsequent fabrication stage in accordance with an alternative embodiment of the present invention, spacers 46, 48 may remain on the respective sidewalls 45, 47 of trench 42 in the completed semiconductor structure, spacers 50, 52 may remain on the sidewalls 51, 53 of trench 44 in the completed semiconductor structure, and cap layer 40 may remain in place while the plugs 56, 58 are formed. After the plugs 56, 58 are formed, the cap layer 40 is stripped. If the cap layer 40 is composed of nitride, a wet isotropic etch process using hot acid, such as phosphoric acid, may be employed to remove nitride selective to oxide and germanium. In this alternative embodiment, the cap layer 40 provides a hard polish stop for the planarization process that removes excess oxide material from surface 38.

References herein to terms such as "vertical", "horizontal", etc. are made by way of example, and not by way of limitation, to establish a frame of reference. The term "horizontal" as used herein is defined as a plane parallel to the conventional plane or surface of substrate 10, regardless of its actual spatial orientation. The term "vertical" refers to a direction perpendicular to the horizontal, as just defined. Terms, such as "on", "above", "below", "side" (as in "sidewall"), "higher", "lower", "over", "beneath" and "under", are defined with respect to the horizontal plane. It is understood that various other frames of reference may be employed for describing the present invention without departing from the spirit and scope of the present invention.

The fabrication of the semiconductor structure herein has been described by a specific order of fabrication stages and steps. However, it is understood that the order may differ from that described. For example, the order of two or more fabrication steps may be switched relative to the order shown. Moreover, two or more fabrication steps may be conducted either concurrently or with partial concurrence. In addition, various fabrication steps may be omitted and other fabrication steps may be added. It is understood that all such variations are within the scope of the present invention. It is also understood that features of the present invention are not necessarily shown to scale in the drawings.

While the present invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. Thus, the invention in its broader aspects is therefore not limited to the specific details, representative apparatus and method, and illustrative example shown and described. Accordingly, departures may be made from such details without departing from the spirit or scope of applicants' general inventive concept.

What is claimed is:

1. A method of fabricating a germanium-on-insulator semiconductor structure, comprising:
   forming a porous layer containing silicon on a substrate;
   heat treating the porous layer in a hydrogen-rich atmosphere for a time sufficient to form a surface layer containing the silicon from the porous layer;
   after the surface layer is formed, forming a layer of substantially pure crystalline germanium on the surface layer; and
   after the layer of substantially pure crystalline germanium is formed, converting the porous layer to an insulating layer that separates the layer of substantially pure crystalline germanium from the substrate.

2. The method of claim 1 further comprising:
   patterning the layer of substantially pure crystalline germanium to define trenches that extend through the layer of substantially pure crystalline germanium to the surface layer and that partition the layer of substantially pure crystalline germanium.

3. The method of claim 2 wherein the insulating layer is composed of an oxide, and converting the porous layer further comprises:
   directing an oxidizing species through the trenches to the silicon-containing porous layer; and
   reacting the oxidizing species with the silicon-containing porous layer to form the oxide of the insulating layer.

4. The method of claim 3 further comprising:
   filling the trenches with an insulating material.

5. The method of claim 3 wherein the layer of substantially pure crystalline germanium is patterned by etching, and further comprising:
   before the layer of substantially pure crystalline germanium is patterned, covering the layer of substantially pure crystalline germanium with a hardmask;
   patterning the hardmask before the layer of substantially pure crystalline germanium is etched to define the trenches; and
   before the oxidizing species is directed through the trenches to the porous layer, forming sidewall spacers on each trench.

6. The method of claim 5 further comprising:
   removing the patterned hard mask; and
   filling the trenches with an insulating material.

7. The method of claim 6 further comprising:
   removing the sidewall spacers before the trenches are filled with the insulating material.

8. The method of claim 6 wherein filling the trenches with the insulating material further comprises:
   depositing a layer of the insulating material;
   planarizing the insulating material in the layer;
   stopping the planarization on the patterned hard mask; and
   stripping the patterned hard mask.

9. The method of claim 6 further comprises:
   depositing a liner material on a sidewall and bottom of each of the trenches and on an exposed surface of the layer of substantially pure crystalline germanium before the trenches are filled with the insulating material.

10. A method of fabricating a germanium-on-insulator semiconductor structure, comprising:
    forming a porous layer containing silicon on a substrate;
    heat treating the porous layer in a hydrogen-rich atmosphere for a time sufficient to form a surface layer containing the silicon from the porous layer;
    after the surface layer is formed, forming a layer of substantially pure crystalline germanium on the surface layer; and
    after the layer of substantially pure crystalline germanium is formed, oxidizing the silicon-containing porous layer to form an insulating layer composed of an oxide that separates the layer of substantially pure crystalline germanium from the substrate.

11. The method of claim 1 wherein forming the layer of substantially pure crystalline germanium further comprises:
    epitaxially depositing the layer of substantially pure germanium on the surface layer.

12. The method of claim 10 wherein the oxide is silicon dioxide.

13. The method of claim 10 further comprising:
    patterning the layer of substantially pure crystalline germanium to define trenches that extend through the layer of substantially pure crystalline germanium to the surface layer and that partition the layer of substantially pure crystalline germanium.

14. The method of claim 13 wherein oxidizing the silicon-containing porous layer further comprises:
    directing an oxidizing species through the trenches to the silicon-containing porous layer; and
    reacting the oxidizing species with the silicon-containing porous layer to form the oxide layer.

15. The method of claim 13 further comprising:
    filling the trenches with an insulating material.

16. The method of claim 10 wherein the layer of substantially pure crystalline germanium is patterned by etching, and further comprising:
    before the layer of substantially pure crystalline germanium is patterned, covering the layer of substantially pure crystalline germanium with a hardmask;
    patterning the hardmask before the layer of substantially pure crystalline germanium is etched to define the trenches; and
    before the oxidizing species is directed through the trenches to the porous layer, forming sidewall spacers on each trench.

17. The method of claim 16 further comprising:
    removing the patterned hard mask; and
    filling the trenches with an insulating material.

18. The method of claim 17 further comprising:
    removing the sidewall spacers before the trenches are filled with the insulating material.

19. The method of claim 17 wherein filling the trenches with the insulating material further comprises:
    depositing a layer of the insulating material;
    planarizing the insulating material in the layer;
    stopping the planarization on the patterned hard mask; and
    stripping the patterned hard mask.

20. The method of claim 17 further comprises:
    depositing a liner material on a sidewall and bottom of each of the trenches and on an exposed surface of the layer of substantially pure crystalline germanium before the trenches are filled with the insulating material.

21. The method of claim 10 wherein forming the layer of substantially pure crystalline germanium further comprises:
    epitaxially depositing the layer of substantially pure germanium on the surface layer.

22. The method of claim 3 wherein the oxide is silicon dioxide.

* * * * *